US008958258B2

(12) United States Patent  (10) Patent No.: US 8,958,258 B2
Okuma  (45) Date of Patent: Feb. 17, 2015

(54) SEMICONDUCTOR DEVICE AND TEST METHOD THEREOF

(75) Inventor: Sadayuki Okuma, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 317 days.

(21) Appl. No.: 13/182,140

(22) Filed: Jul. 13, 2011

(65) Prior Publication Data

US 2012/0014197 A1  Jan. 19, 2012

(30) Foreign Application Priority Data

Jul. 15, 2010 (JP) ................................. 2010-160555

(51) Int. Cl.
| | | |
|---|---|---|
| *G11C 29/00* | (2006.01) | |
| *G11C 7/12* | (2006.01) | |
| *G11C 8/08* | (2006.01) | |
| *G11C 11/4099* | (2006.01) | |
| *G11C 8/14* | (2006.01) | |
| *G11C 11/408* | (2006.01) | |
| *G11C 29/02* | (2006.01) | |
| *G11C 29/24* | (2006.01) | |
| *G11C 29/12* | (2006.01) | |

(52) U.S. Cl.
CPC .............. *G11C 11/4099* (2013.01); *G11C 8/14* (2013.01); *G11C 11/4085* (2013.01); *G11C 29/02* (2013.01); *G11C 29/025* (2013.01); *G11C 29/24* (2013.01); *G11C 2029/1202* (2013.01)
USPC ..................... 365/210.1; 365/201; 365/230.06

(58) Field of Classification Search
CPC ........ G11C 29/50; G11C 29/06; G11C 29/34; G11C 8/10; G11C 8/08; G11C 8/14; G11C 11/4085
USPC .......................... 365/201, 230.06, 203, 210.1
See application file for complete search history.

(56) References Cited

U.S. PATENT DOCUMENTS

| | | | | |
|---|---|---|---|---|
| 6,580,649 | B2 * | 6/2003 | Park ......................... | 365/189.07 |
| 6,628,536 | B2 * | 9/2003 | Tomotani ................. | 365/51 |
| 6,977,834 | B2 * | 12/2005 | Onizawa et al. ......... | 365/63 |
| 7,420,860 | B2 * | 9/2008 | Yamada et al. .......... | 365/201 |
| 7,993,961 | B2 * | 8/2011 | Oh et al. .................. | 438/102 |
| 2010/0034004 | A1 | 2/2010 | Okahiro et al. | |

FOREIGN PATENT DOCUMENTS

JP          2010-40131 A        2/2010

* cited by examiner

*Primary Examiner* — Hoai V Ho
*Assistant Examiner* — Tri Hoang
(74) *Attorney, Agent, or Firm* — Sughrue Mion, PLLC

(57) ABSTRACT

A semiconductor device includes a plurality of memory mats, each of which includes a plurality of word lines, a plurality of bit lines, a plurality of memory cells that are arranged at intersections of the word lines and the bit lines, and a plurality of dummy word lines, each of which is sandwiched between two corresponding ones of the word lines; a main dummy word line to which the dummy word lines included in the memory mats are commonly electrically connected; and a dummy-word-line control circuit that detects an electric potential of the main dummy word line when a test signal is activated, and outputs an error signal when the electric potential exceeds a predetermined threshold value. According to the present invention, because an electric potential of each of the dummy word lines is directly detected, an address of the word line, which has a short circuit with the dummy word line, can be reliably detected in a short time.

15 Claims, 9 Drawing Sheets

SEMICONDUCTOR DEVICE AND TEST METHOD THEREOF

CROSS-REFERENCE TO RELATED APPLICATION

This application claims priority under 35 U.S.C. §119 from Japanese Patent Application No. 2010-160555, filed on Jul. 15, 2010, in the Japanese Intellectual Property Office, the disclosure of which is incorporated herein by reference in its entirety.

BACKGROUND OF THE INVENTION

1. Field of the Invention

The present invention relates to a semiconductor device and a test method thereof, and more particularly relates to a semiconductor device including dummy word lines and a test method thereof.

2. Description of Related Art

The memory capacity required in memory devices such as DRAMs (Dynamic Random Access Memories) is increasing every year, and an area occupied by each memory cell to realize the increased memory capacity is steadily reducing. For example, a layout in which an area occupied by each memory cell is $6F^2$ has been known, where F is a minimum feature size (Japanese Patent Application Laid-open No. 2010-040131).

When the layout described in Japanese Patent Application Laid-open No. 2010-040131 is adopted, a dummy word line is arranged alternating with every two word lines. The dummy word line is a dummy wiring that essentially does not contribute to any actual operations, and is provided only to maintain a constant wiring density of a wiring layer in which the word lines and the dummy word lines are provided.

Because the dummy word line is the dummy wiring that essentially does not contribute to any actual operations as mentioned above, an electric potential of the dummy word line can be set arbitrarily, thereby the dummy word line can be set to be in a floating state. When the dummy word line is set to be in a floating state, because there is no need to supply a predetermined electric potential to the dummy word line, an element such as a wiring or a connector is not required for the dummy word line. Therefore, there is an advantage that overhead in terms of area does not occur in an area where word line drivers are formed.

However, because the electric potential of the dummy word line becomes unstable when it is set to be in a floating state, the dummy word line is likely to become a noise source for neighboring elements or wirings. To prevent this problem, one approach is to supply a predetermined electric potential to the dummy word line. However, in this case, if there is a short circuit or minute current leakage between the word line and the dummy word line, a leakage current flows between the word line and the dummy word line, making the word line defective and creating a need to replace the defective word line with an auxiliary word line. In this case, because a certain length of time needs to be spent to specifically detect the word line defect caused by the minute current leakage to the dummy word line, there is a problem that the time necessary for an operation test at a manufacturing stage becomes longer.

This problem is not limited to DRAMs, but also occurs in other memory devices (such as SRAM, PRAM, MRAM, FeRAM, and ReRAM) in which dummy word lines are provided adjacent to word lines or in all semiconductor devices including some circuits similar to such memory devices.

SUMMARY

In one embodiment, there is provided a semiconductor device includes: a plurality of memory mats, each of which including a plurality of word lines, a plurality of bit lines, a plurality of memory cells arranged at intersections of the word lines and the bit lines, and a plurality of dummy word lines, each of the dummy word lines is sandwiched between corresponding two of the word lines; a main dummy word line electrically connected in common to the dummy word lines included in at least one of the memory mats; and a dummy-word-line control circuit that detects an electric potential of the main dummy word line when a test signal is activated, and outputs an error signal when the electric potential exceeds a predetermined threshold value.

In another embodiment, there is provided a semiconductor device that includes: a word line connected to a plurality of memory cells; a dummy word line provided adjacent to the word line; a dummy-word-line driving circuit that supplies a first electric potential to the dummy word line; and a detection circuit that detects an electric potential of the dummy word line when the dummy-word-line driving circuit is in an inactive state.

In still another embodiment, there is provided a method comprising: precharging a plurality of dummy word lines at a first potential, the dummy word lines being arranged in a memory mat; charging an electrical potential of one of word lines to a second potential different from the first potential after the precharging, the word lines being arranged in the memory mat; and producing an output signal when the dummy word lines reach a third potential by the charging the electrical potential of the one of the word lines.

According to the present invention, because a circuit that supplies a predetermined electric potential to a dummy word line is provided, a noise generated due to an unstable electric potential of the dummy word line can be suppressed. Furthermore, because the electric potential of the dummy word line can be directly detected, an address of a word line, which is short-circuited with the adjacent dummy word line, or in which minute current leakage is generated, can be reliably detected in a short time as compared to a method of detecting an increase in a current consumed by an entire chip, and a method of selecting word lines using special test patterns. Accordingly, the time required for an operation test at a manufacturing stage can be shortened.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
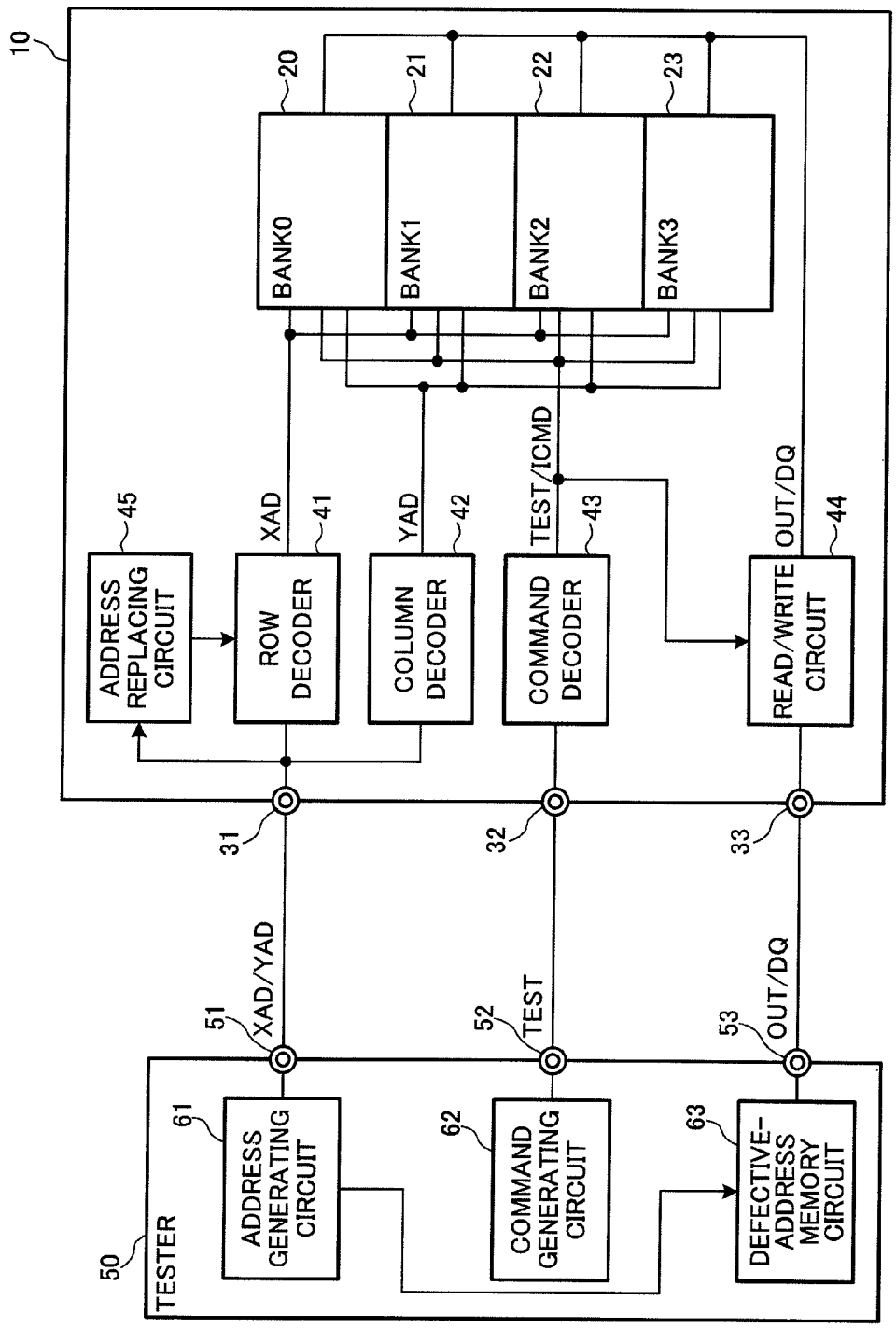
FIG. 1 is a block diagram of main parts of a semiconductor device 10 according to a first embodiment of the present invention.

FIG. 1 is a block diagram of main parts of a semiconductor device 10 according to a first embodiment of the present invention.

The semiconductor device 10 according to the first embodiment is a DRAM, and as shown in FIG. 1, the semiconductor device 10 includes four banks 20 to 23. The banks 20 to 23 are unit structures that can independently receive commands, and have mutually the same circuit configuration. The configuration of the banks 20 to 23 is described later.

The semiconductor device 10 includes an address terminal 31, a command terminal 32, and a data terminal 33 as external terminals. The address terminal 31 is a terminal that receives a row address XAD or a column address YAD from outside. The row address XAD input in the address terminal 31 is supplied to a row decoder 41, and the column address YAD is supplied to a column decoder 42. The row decoder 41 is a circuit that selects any word line included in the banks 20 to 23 by decoding the row address XAD. The column decoder 42 is a circuit that selects any sense amplifier included in the banks 20 to 23 by decoding the column address YAD. With this configuration, in a read operation, a read data DQ from a memory cell selected by the row address XAD and the column address YAD is output to outside via a read/write circuit 44 and the data terminal 33. On the other hand, in a write operation, a write data DQ input from outside via the data terminal 33 and the read/write circuit 44 is overwritten in a memory cell selected by the row address XAD and the column address YAD.

Discrimination between the read operation and the write operation is made based on a command CMD input from outside via the command terminal 32. The command CMD input in the command terminal 32 is decoded by a command decoder 43, and various internal commands ICMD are generated therefrom. Particularly, when the command CMD indicates a test command, the command decoder 43 activates a test signal TEST. The test signal TEST is supplied to all the banks 20 to 23 and also to the read/write circuit 44.

As shown in FIG. 1, a tester 50 is connected to the semiconductor device 10 during a testing operation. The tester 50 includes an address terminal 51, a command terminal 52, and a data terminal 53 as external terminals. The address terminal 51, the command terminal 52, and the data terminal 53 are respectively connected to the address terminal 31, the command terminal 32, and the data terminal 33 of the semiconductor device 10. The address terminal 51 supplies the row address XAD generated by an address generating circuit 61 to the semiconductor device 10. The command terminal 52 supplies the command CMD generated by a command generating circuit 62 to the semiconductor device 10. The data terminal 53 receives an error signal OUT from the semiconductor device 10, and an output of the address generating circuit 61 when the error signal OUT is activated is stored as a defective address in a defective-address memory circuit 63.

The defective address stored in the defective-address memory circuit 63 is written in an address replacing circuit 45 of the semiconductor device 10. The address replacing circuit 45 includes non-volatile memory elements such as fuses, anti-fuses, or ROM elements, and stores therein the written defective address in a non-volatile manner. The row address XAD input in the address terminal 31 is supplied to the address replacing circuit 45 during actual usage. The address replacing circuit 45 compares the row address XAD with the defective address stored therein. As a result of the comparison, when the defective address matches with the input row address XAD, the address replacing circuit 45 outputs to the row decoder 41 an auxiliary address corresponding to the defective address. In this manner, the defective address is replaced by the auxiliary address and an alternative access is made to an auxiliary word line instead of a defective word line.

Although not particularly limited thereto, detection and writing of a defective address are performed in parallel using the tester 50 for a plurality of the semiconductor devices 10 in a wafer state. Meanwhile, when the address replacing circuit 45 is constituted by fuses, a laser trimmer that is different from the tester 50 is used to write the defective address to the address replacing circuit 45.

Figure 2:
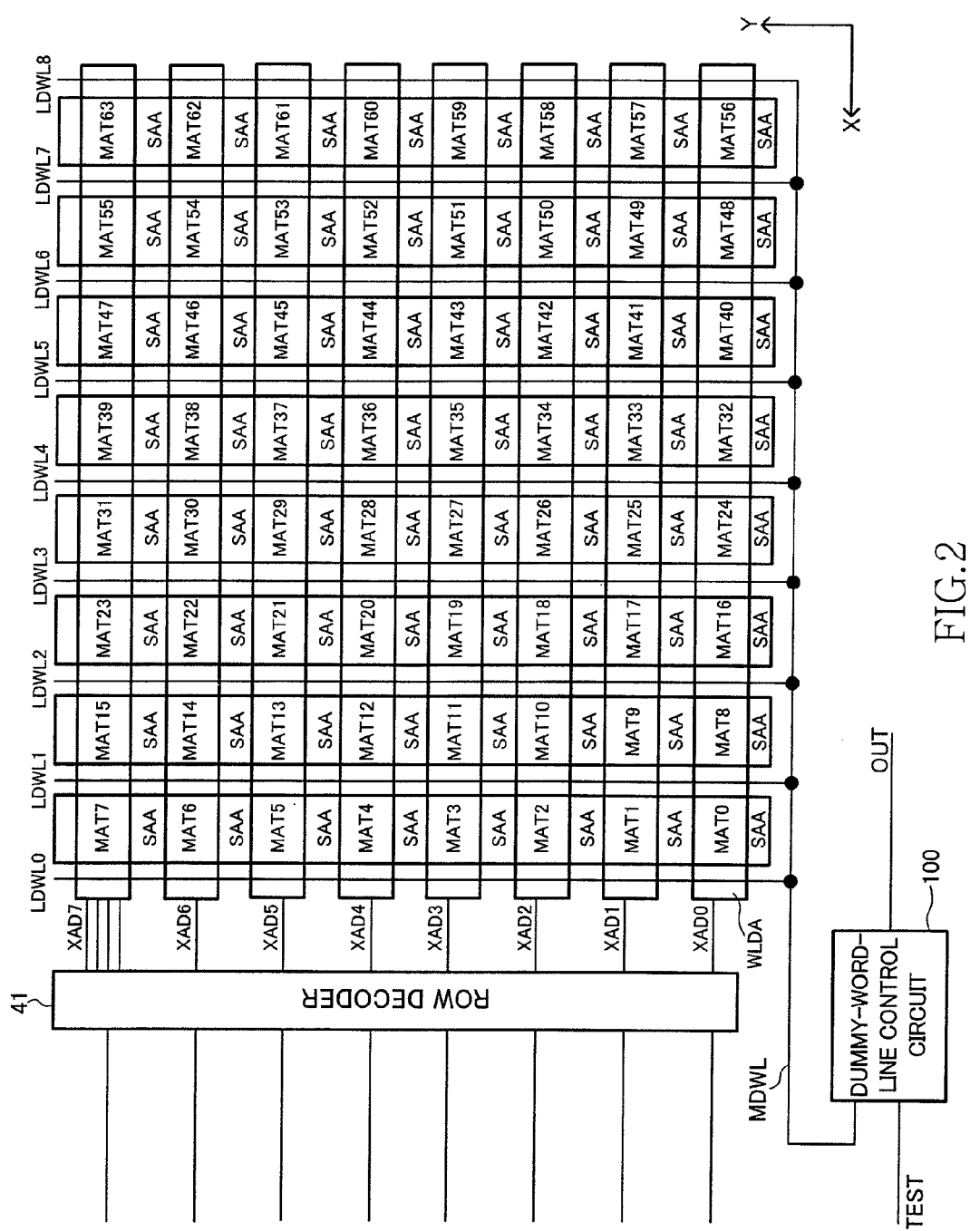
FIG. 2 is a schematic diagram for explaining a bank structure.

FIG. 2 is a schematic diagram for explaining a bank structure.

As shown in FIG. 2, each of the banks has a configuration in which a total of 64 memory mats MAT0 to MAT63 are arranged in a matrix of eight memory mats arranged in an X direction and eight memory mats arranged in a Y direction. As shown in FIG. 2, word-line driver arrays WLDA are arranged on both sides of each memory mat in the X direction to provide a matrix of the word-line driver arrays WLDA. Sense amplifier arrays SAA are arranged on both sides of each memory mat in the Y direction to provide a matrix of the sense amplifier arrays SAA. The row decoder 41 generates outputs XAD0 to XAD7 for each row of the matrix of the word-line driver arrays WLDA, and each of the outputs XAD0 to XAD7 is commonly supplied to the word-line driver arrays WLDA belonging to the corresponding row. Furthermore, each of local dummy word lines LDWL0 to LDWL8 is provided for each column of the matrix of the word-line driver arrays WLDA, and each of the local dummy word lines LDWL0 to LDWL8 is allocated to the word-line driver arrays WLDA belonging to the corresponding column. Therefore, two local dummy word lines are allocated to corresponding column of the matrix of the memory mats. The local dummy word lines LDWL0 to LDWL8 are wirings that extend in the Y direction. The local dummy word lines LDWL0 to LDWL8 are occasionally referred to as "first main dummy word lines".

The local dummy word lines LDWL0 to LDWL8 are commonly connected to a main dummy word line MDWL that extends in the X direction. The main dummy word line MDWL is occasionally referred to as "second main dummy word line".

The main dummy word line MDWL is connected to a dummy-word-line control circuit 100. Operations of the dummy-word-line control circuit 100 are controlled by the test signal TEST. Although the details are explained later, when the test signal TEST is in an inactive state, the dummy-word-line control circuit 100 supplies a predetermined electric potential to the main dummy word line MDWL. On the other hand, when the test signal TEST is in an active state, the dummy-word-line control circuit 100 sets the main dummy word line MDWL to be in a floating state and measures the electric potential of the main dummy word line MDWL in this state. As a result of the measurement, when the electric potential of the main dummy word line MDWL exceeds a predetermined threshold value, the dummy-word-line control circuit 100 activates the error signal OUT.

Figure 3:
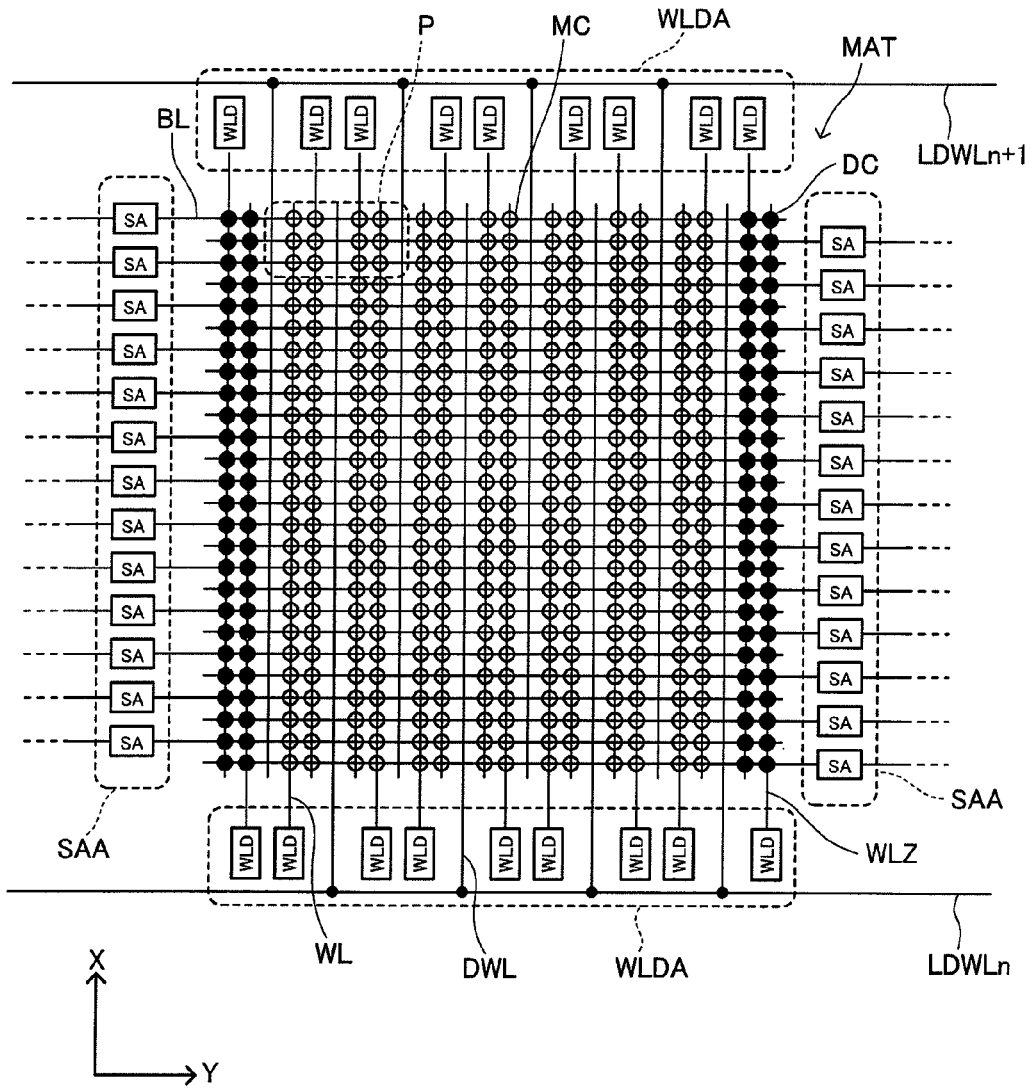
FIG. 3 is a diagram showing a circuit configuration of a memory mat MAT.

FIG. 3 shows a circuit configuration of a memory mat MAT.

As shown in FIG. 3, the memory mat MAT includes a plurality of word lines WL wired in an X direction, a plurality of bit lines BL wired in a Y direction, and memory cells MC arranged at intersections of the word lines WL and the bit lines BL. The number of the word lines WL and the bit lines BL shown in FIG. 3 is only an example, and the present invention is not limited thereto. In practice, each memory mat MAT includes 512 word lines WL, for example.

Among the word lines WL, the half of the word lines WL are connected to the word-line driver array WLDA arranged on one side of the memory mat MAT in the X direction and the remaining half of the word lines WL are connected to the word-line driver array WLDA arranged on the other side of the memory mat MAT in the X direction. Each of the word-line driver arrays WLDA includes a plurality of word line drivers WLD each of which drives a corresponding one of the word lines WL.

Although not particularly limited thereto, some of the word lines that are located at edges in the Y direction (in the first embodiment, two word lines at each edge) are not used, and are regarded as unused word lines WLZ. This is because defective cells are easily generated at the edges of the memory mat since processing conditions during manufacturing slightly differ between the edges and a central portion of the memory mat. Therefore, memory cells connected to the unused word lines WLZ are handled as dummy cells DC. Note that, because the unused word lines WLZ are always in an inactive state, the dummy cells DC are not connected to the bit lines BL.

Dummy word lines DWL, which are arranged alternating with every two word lines WL wired in the X direction, are further provided in the memory mat MAT. That is, a combination of two word lines WL and a corresponding dummy word line DWL is considered as a unit structure and this structure is repeatedly arranged in the Y direction. In other words, each of the dummy word lines DWL is sandwiched between two word lines WL on both sides. As shown in FIG. 3, the dummy word line DWL is connected to a corresponding one of the local dummy word lines LDWL. In the example shown in FIG. 3, each of the dummy word lines DWL is alternately connected to a local dummy word line LDWLn and another local dummy word line LDWLn+1; however, the present invention is not limited to this configuration, and each of the dummy word lines DWL can be connected to any one of the local dummy word lines LDWLn and LDWLn+1.

No memory cells MC or the dummy cells DC are arranged at intersections of the dummy word lines DWL and the bit lines BL. That is, the dummy word line DWL is a dummy wiring that essentially does not contribute to any actual operations. The dummy word lines DWL are provided because a layout is adopted in which an area occupied by the memory cells MC is $6F^2$, where F is a minimum feature size.

Figure 4:
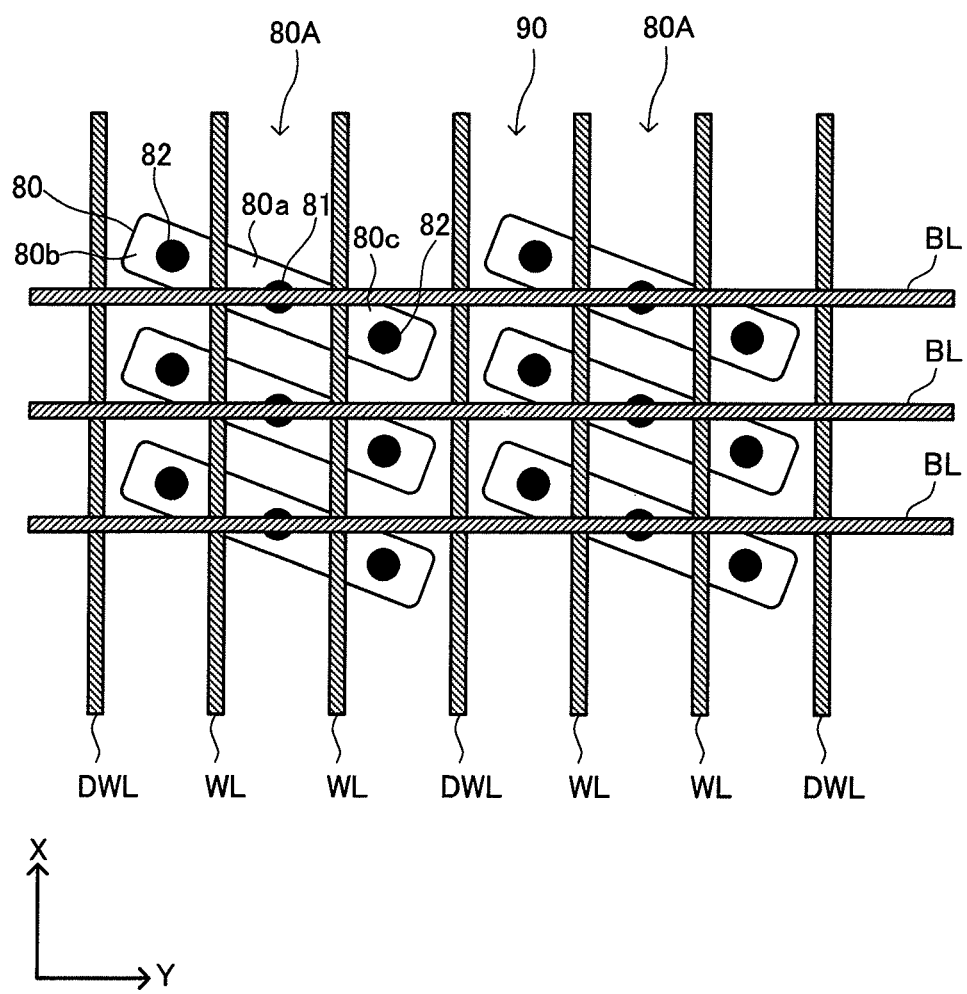
FIG. 4 is an enlarged view of a region P of FIG. 3 and shows a layout of an active region in the memory mat MAT.

FIG. 4 is an enlarged view of a region P of FIG. 3 and shows a layout of an active region in the memory mat MAT.

As shown in FIG. 4, in the first embodiment, a long side of an active region 80 is slightly inclined relative to a Y direction. Many active regions 80 arranged in an X direction form an active region array 80A extending in the X direction. A plurality of the active region arrays 80A are arranged in the Y direction.

With this structure, two adjacent word lines WL always pass over the same active region. In such a layout, because the wiring density of the word lines WL is not uniform, the dummy word line DWL is arranged alternating with every two word lines WL to make the wiring density of the word lines WL and the dummy word lines DWL uniform. The wiring density is made uniform to secure favorable processing conditions. With this configuration, the dummy word line DWL is wired along an element isolation region 90 located between the adjacent active region arrays 80A.

The active region 80 includes three diffusion regions 80a to 80c, the word lines WL pass over the active regions 80 between the diffusion regions 80a and 80b and between the diffusion regions 80a and 80c. In this manner, the two adjacent diffusion regions and the word line WL constitute a cell transistor of the memory cell MC. The diffusion region 80a located at the center is connected to corresponding one of the bit lines BL via a bit contact 81, and the diffusion regions 80b and 80c located at both ends are connected to corresponding cell capacitors via cell contacts 82. As described above, the memory cells MC are arranged respectively at the intersections of the two adjacent bit lines BL and the two adjacent word lines WL and the layout in which the area occupied by the memory cells MC is $6F^2$ is realized.

Figure 5:
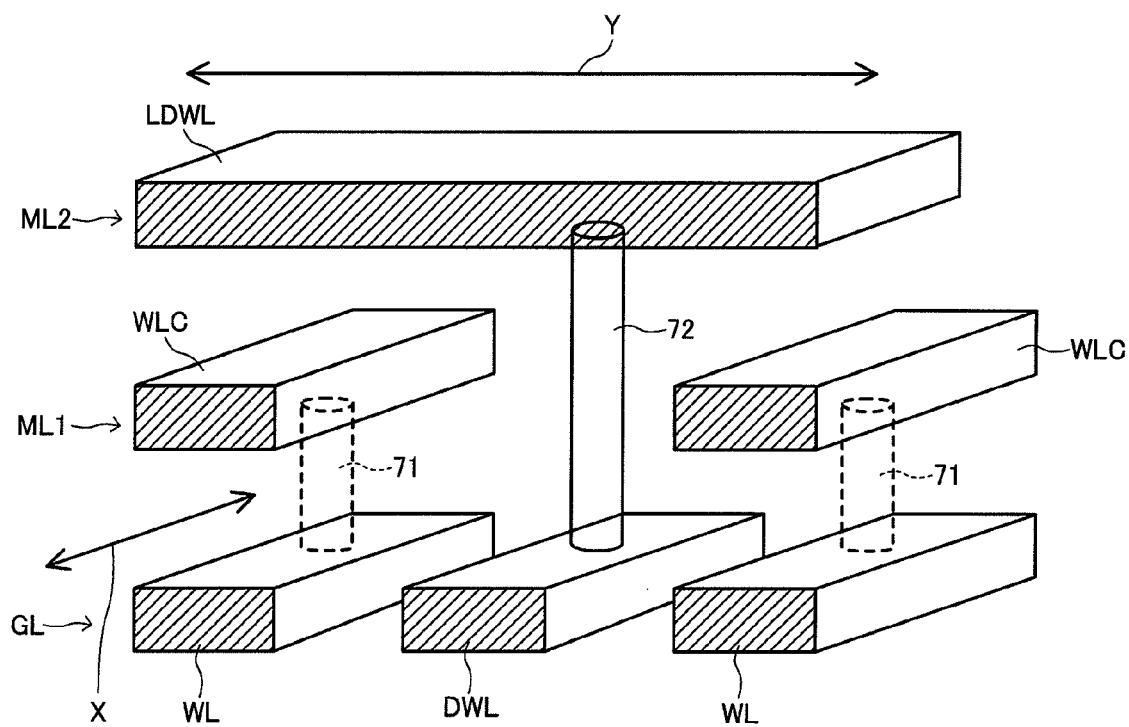
FIG. 5 is a schematic perspective view for explaining a wiring structure of a word line WL and a dummy word line DWL at an edge.

FIG. 5 is a schematic perspective view for explaining a wiring structure of the word line WL and the dummy word line DWL at an edge.

As shown in FIG. 5, the word lines WL and the dummy word line DWL are formed in a lowermost wiring layer GL. In the lowermost wiring layer GL, a gate electrode of a transistor is formed. In this structure, the word line WL is connected to a connecting conductor WLC, which is formed in a first metal wiring layer ML1, via a contact conductor 71. The connecting conductor WLC connects the word line WL and the word line driver WLD, and extends in an X direction as shown in FIG. 5.

Meanwhile, the dummy word line DWL is connected to the local dummy word line LDWL, which is formed in a second metal wiring layer ML2, via a contact conductor 72. As shown in FIG. 5, the local dummy word line LDWL extends in a Y direction.

In this manner, narrowing of a wiring pitch of the connecting conductor WLC can be achieved by forming the connecting conductor WLC in the first metal wiring layer ML1 as a lower layer. Further, an increase in a conductor width and a conductor thickness of the local dummy word line LDWL can be achieved by forming the local dummy word line LDWL in the second metal wiring layer ML2 as an upper layer. As a result, a wiring resistance of the local dummy word line LDWL can be reduced. Meanwhile, it is not essential that the local dummy word line LDWL be formed in the second metal wiring layer ML2, and for example, the local dummy word line LDWL can be formed in the lowermost wiring layer GL. However, because the wiring resistance of the local dummy word line LDWL increases when it is formed in the wiring layer GL, as described above, it is desirable to form the local dummy word line LDWL in the second metal wiring layer ML2.

Figure 6:
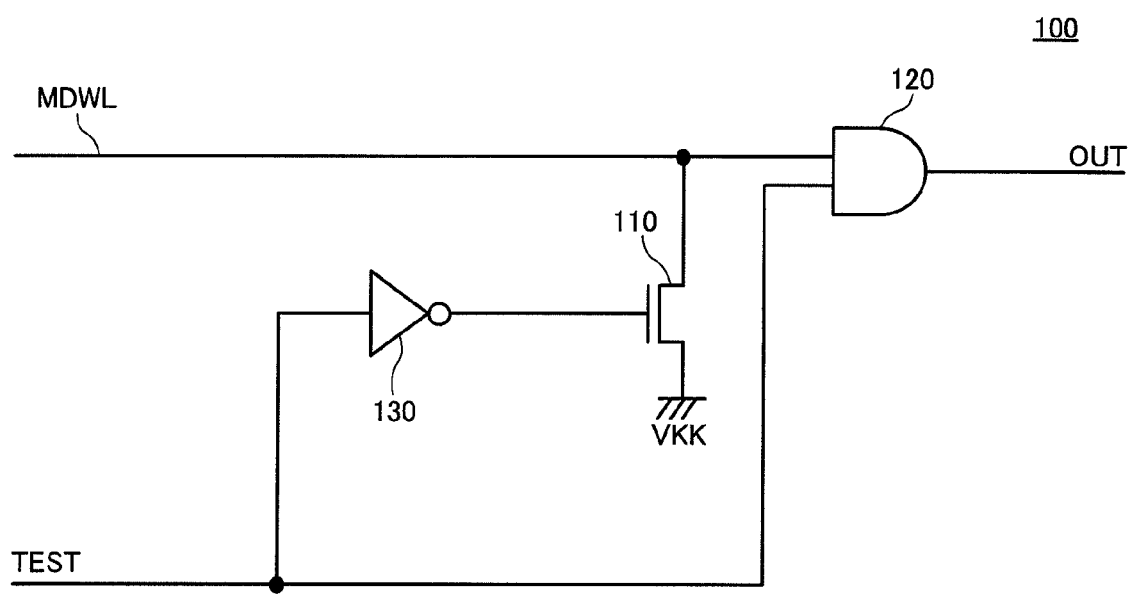
FIG. 6 is a circuit diagram of a dummy-word-line control circuit 100 shown in FIG. 2.

FIG. 6 is a circuit diagram of the dummy-word-line control circuit 100 shown in FIG. 2.

As shown in FIG. 6, the dummy-word-line control circuit 100 includes an N-channel MOS transistor 110 connected between the main dummy word line MDWL and a power source wiring to which a negative electric potential VKK is applied, and an AND gate circuit 120 to which the electric potential of the main dummy word line MDWL and the test signal TEST are input. An inverted signal of the test signal TEST is supplied to a gate of the transistor 110 via an inverter 130. The ground potential may be used instead of the negative electric potential VKK.

With this configuration, when the test signal TEST is inactivated to a low level, the transistor 110 is turned on, and thereby the negative electric potential VKK is applied to the main dummy word line MDWL. The negative electric potential VKK is lower than a ground potential, and applied to the word lines WL that are not selected by the word line driver WLD. A selection electric potential VPP that is higher than the ground potential is applied to the selected word lines WL. In this manner, when the test signal TEST is in an inactive state, the negative electric potential VKK is applied to all the dummy word lines DWL via the main dummy word line MDWL and the local dummy word line LDWL. Accordingly, the transistor 110 functions as a dummy-word-line driving circuit that applies the negative electric potential VKK to the dummy word line DWL.

On the other hand, when the test signal TEST is activated to a high level, the transistor 110 is turned off. Therefore, the main dummy word line MDWL is disconnected from the negative electric potential VKK. Accordingly, when the test signal TEST is in an active state, because no electric potential is supplied to the main dummy word line MDWL, all the dummy word lines DWL are set to be in a floating state.

Therefore, when the test signal TEST is changed from a low level to a high level, the electric potential of the main dummy word line MDWL is maintained at the negative electric potential VKK. However, in cases where there is a short circuit or minute current leakage between the word line WL and the dummy word line DWL adjacent to each other, when the word line WL is activated to the selection electric potential VPP, the electric potential of the dummy word line DWL increases due to the short circuit or the minute current leakage. Due to this, the electric potentials of the local dummy word line LDWL and the main dummy word line MDWL also increase. If the electric potential of the main dummy word line MDWL exceeds a threshold value of the AND gate circuit 120, the error signal OUT that is output from the AND gate circuit 120 is changed to a high level. Therefore, the AND gate circuit 120 functions as a detection circuit that detects the electric potential of the dummy word line DWL.

The configuration of the semiconductor device 10 according to the first embodiment is as described above. An operation for testing the semiconductor device 10 is explained below.

Figure 7:
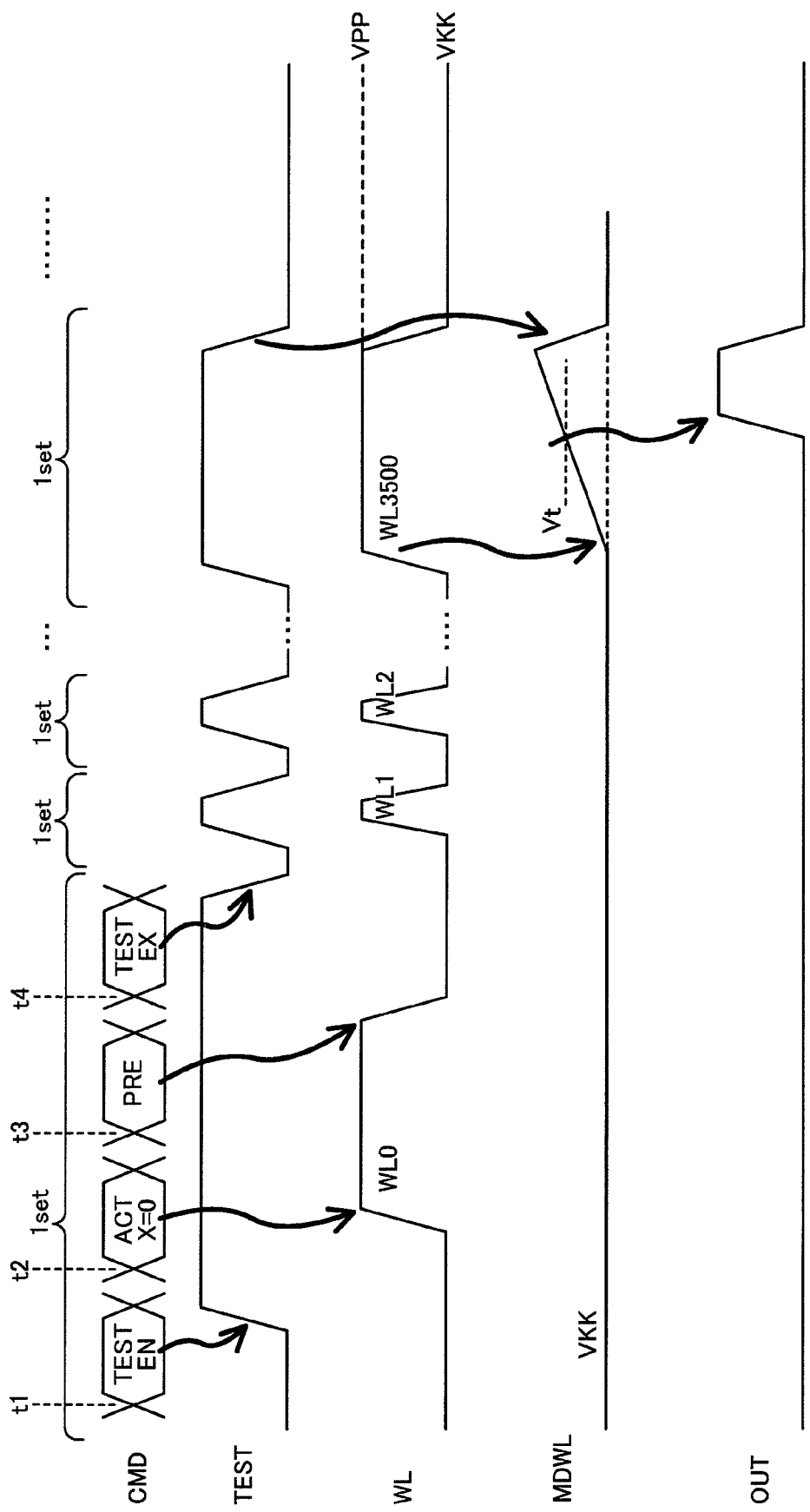
FIG. 7 is a timing chart for explaining an operation when performing test in the semiconductor device 10.

FIG. 7 is a timing chart for explaining an operation when performing test the semiconductor device 10 according to the first embodiment.

Testing of the semiconductor device 10 is performed in a state where the tester 50 is connected to the semiconductor device 10 as shown in FIG. 1. First, as shown in FIG. 7, the test signal TEST is at a low level before a time t1. Therefore, the transistor 110 shown in FIG. 6 is in an on-state and the negative electric potential VKK is applied to all the dummy word lines DWL via the main dummy word line MDWL and the local dummy word lines LDWL.

Next, a test command (TESTEN) is input into the command terminal 32 from the tester 50 to make the semiconductor device enter into a test mode (the time t1). When the semiconductor device 10 enters into the test mode, the test signal TEST is activated to a high level. Consequently, the transistor 110 turns off, and thereby all the dummy word lines DWL are set to be in a floating state with the electric potentials thereof precharged to the negative electric potential VKK. In this state, an active command (ACT) is input into the command terminal 32 and the predetermined row address XAD is input into the address terminal 31 (a time t2). In the example shown in FIG. 7, a value of the row address XAD input in the time t2 is X=0. Accordingly, a word line WL0 indicated by the row address XAD is activated to the selection electric potential VPP.

After the state described above is maintained for a certain period of time, a precharge command (PRE) is input into the command terminal 32, and then a selection of the word line WL is reset (a time t3). During this period, because the test signal TEST is maintained at a high level, the electric potential of the main dummy word line MDWL is expected to increase if there is a short circuit or minute current leakage between the selected word line WL0 and the dummy word line DWL adjacent to the word line WL0. In the example shown in FIG. 7, because there is no short circuit or minute current leakage between the word line WL0 and the dummy word line DWL, the electric potential of the main dummy word line MDWL is maintained at the negative electric potential VKK, and therefore the error signal OUT is maintained at a low level.

Thereafter, a test exit command (TESTEX) is input into the command terminal 32 and the transistor 110 is again turned on (a time t4).

The series of operations described above is considered as one set and the test described above is performed for all the word lines WL by changing the value of the row address XAD. The value of the row address XAD can be changed by simply incrementing or decrementing; however, as long as the word lines WL are sequentially selected, the value of the row address XAD can be changed in any way.

In the example shown in FIG. 7, in a test performed for a word line WL3500, the electric potential of the main dummy word line MDWL increases and exceeds a threshold value Vt of the AND gate circuit 120. Accordingly, the error signal OUT is changed to a high level and the high-level error signal OUT is output to the tester 50 from the data terminal 33.

As shown in FIG. 1, the error signal OUT input into the tester 50 is supplied to the defective-address memory circuit 63. Because the row address XAD in the current test is supplied from the address generating circuit 61 to the defective-address memory circuit 63, it is possible to determine which one of the row address XAD is the defective address. The determined defective address is then written in the defective-address memory circuit 63.

Figure 8:
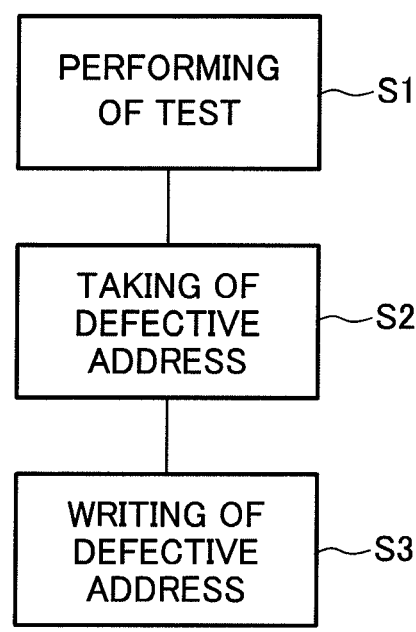
FIG. 8 is a flowchart for explaining a testing operation performed by a tester 50.

FIG. 8 is a flowchart for explaining a testing operation performed by the tester 50.

Step S1 shown in FIG. 8 indicates a detection operation of a defective address explained with reference to FIG. 7. The tester 50 inputs different row addresses XAD sequentially while repeatedly issuing the test command (TESTEN) and the test exit command (TESTEX), and monitors whether the error signal OUT is generated. The row address XAD is stored in the defective-address memory circuit 63 whenever the error signal OUT is activated (Step S2).

After the test is performed for all the row addresses XAD in this manner, defective addresses stored in the defective-address memory circuit 63 are stored in the address replacing circuit 45 included in the semiconductor device 10 (Step S3). For writing the defective addresses to the address replacing circuit 45, the tester 50 can be used or a laser trimmer that is different from the tester 50 can be used when the address replacing circuit 45 is constituted by fuses.

With the above configuration, defective addresses included in the semiconductor device 10 are detected, and the detected defective addresses are written in the address replacing circuit 45. When the defective address is accessed during actual usage, an alternative access is made to an auxiliary word line instead of the defective word line WL. That is, the semiconductor device 10 can be handled as a non-defective product.

In this manner, according to the first embodiment, when there is a short circuit or minute current leakage between the word line WL and the dummy word line DWL, the short circuit or the minute current leakage can be directly detected in the test mode. Therefore, as compared to a case of using an indirect method of detecting an increase in a consumed current, the defective address can be reliably detected within a short time. Further, during actual usage, the dummy word lines DWL do not become a cause for noise because all the dummy word lines DWL are fixed to the negative electric potential VKK. Furthermore, the word line WL, which has a short circuit with the adjacent dummy word line DWL or in which minute current leakage is generated is not activated (that is, fixed to the negative electric potential VKK) due to the control on the address replacing circuit 45. Consequently, there is no flow of a leakage current between the word line WL and the dummy word line DWL.

Figure 9:
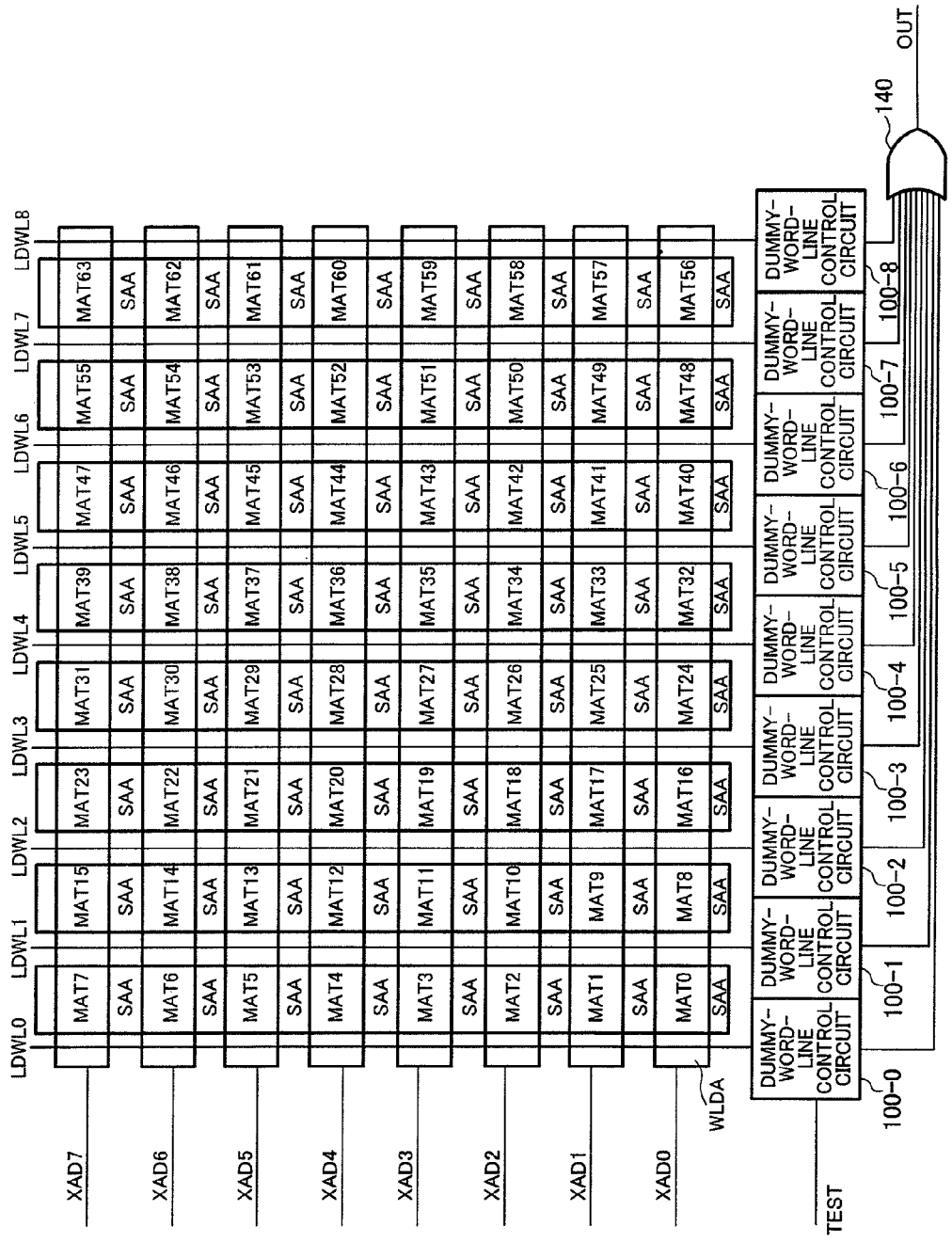
FIG. 9 is an explanatory diagram of a second embodiment of the present invention.

FIG. 9 is an explanatory diagram of a second embodiment of the present invention.

In the second embodiment, as shown in FIG. 9, dummy-word-line control circuits 100-0 to 100-8 are respectively allocated to the local dummy word lines LDWL0 to LDWL8. That is, in the second embodiment, a main dummy word line MDWL that connects the local dummy word lines LDWL0 to LDWL8 is not provided. Signals output from the dummy-word-line control circuits 100-0 to 100-8 are integrated by an OR gate circuit 140 and the integrated signal is output to outside as a single error signal OUT. Therefore, the procedure of the testing operation using the tester 50 is the same as that described in the first embodiment.

According to the second embodiment, because the number of the dummy word lines DWL connected to each of the dummy-word-line control circuits 100-0 to 100-8 is reduced, a parasitic capacitance of the local dummy word lines LDWL0 to LDWL8 is reduced. Accordingly, the size of the transistor 110 that functions as a dummy-word-line driving circuit can be reduced, and the sensitivity of the AND gate circuit 120 that functions as a detection circuit can be increased. Consequently, tests can be performed faster. Specifically, a time period from the time t2 (issuing an active command) to the time t3 (issuing a precharge command) shown in FIG. 7 can be shortened.

It is apparent that the present invention is not limited to the above embodiments, but may be modified and changed without departing from the scope and spirit of the invention.

For example, in the embodiments described above, there has been explained a case where the present invention is applied to a DRAM. However, the application of the present invention is not limited to DRAMs. The present invention can be also applied to other memory devices (such as SRAM, PRAM, MRAM, FeRAM, and ReRAM) in which dummy word lines are provided adjacent to word lines or to all semiconductor devices including some circuits similar to such memory devices.

Furthermore, the present invention is not limited to semiconductor devices having a layout in which a dummy word line is arranged alternating with every two word lines.

What is claimed is:

1. A semiconductor device comprising:
    a plurality of memory mats, each of which includes a plurality of word lines, a plurality of bit lines, a plurality of memory cells arranged at intersections of the word lines and the bit lines, and a plurality of dummy word lines, each of the dummy word lines is sandwiched between corresponding two of the word lines;
    a main dummy word line electrically connected in common to the dummy word lines included in at least one of the memory mats; and
    a dummy-word-line control circuit that detects an electric potential of the main dummy word line when a test signal is activated, and outputs an error signal when the electric potential exceeds a predetermined threshold value,
    wherein the dummy-word-line control circuit brings the main dummy word line into a floating state when the test signal is activated.

2. The semiconductor device as claimed in claim 1, wherein the dummy-word-line control circuit supplies a first electric potential to the main dummy word line when the test signal is inactivated.

3. The semiconductor device as claimed in claim 2, further comprising a plurality of word line drivers, wherein
    each of the word line drivers supplies a second electric potential to an associated one of the word lines when selecting and supplies the first electric potential to the associated one of the word lines when non-selecting.

4. The semiconductor device as claimed in claim 3, wherein
    the memory mats are arranged in a matrix in which a plurality of columns and a plurality of rows extend in first and second directions, respectively, and
    at least a part of the main dummy word line extends in the first direction, and is commonly connected to the dummy word lines included in the memory mats that belong to at least one of the columns.

5. The semiconductor device as claimed in claim 4, wherein the main dummy word line and the dummy-word-line control circuit are allocated to the memory mats that belong to more than one of the columns.

6. The semiconductor device as claimed in claim 5, wherein
    the main dummy word line includes a plurality of first main dummy word lines that extend in the first direction and a second main dummy word line that extends in the second direction,
    each of the first main dummy word lines is commonly connected to the dummy word lines included in the memory mats that belong to an associated one of the columns,
    the second main dummy word line is commonly connected to the first main dummy word lines, and
    the dummy-word-line control circuit is connected to the first main dummy word lines via the second main dummy word line.

7. The semiconductor device as claimed in claim 4, wherein the main dummy word line and the dummy-word-line control circuit are allocated to each of the columns.

8. The semiconductor device as claimed in claim 4, wherein the word lines and the dummy word lines extend in the second direction and the bit lines extend in the first direction.

9. The semiconductor device as claimed in claim 8, further comprising connecting wirings that connect the word lines and the word line drivers, wherein
    the connecting wirings are formed in a first wiring layer that is different from a second wiring layer in which the part of the main dummy word line that extends in the first direction is formed.

10. The semiconductor device as claimed in claim 9, wherein the first wiring layer is positioned between the second wiring layer and a wiring layer in which the word lines and the dummy word lines are formed.

11. A semiconductor device comprising:
a plurality of memory cells;
a plurality of word lines coupled to corresponding ones of the memory cells, the word lines elongating in parallel in a first direction;
a plurality of dummy word lines each arranged between corresponding two of the word lines, the dummy word lines elongating in parallel in the first direction;
a main dummy word line directly coupled, and in common, to the dummy word lines, the main dummy word line elongating in a second direction perpendicular to the first direction; and
a dummy word line control circuit physically connected to the main dummy word line and not physically contacting each of the dummy word lines, the dummy word line control circuit being configured to detect a potential of the main dummy word line.

12. The semiconductor device as claimed in claim 11, wherein each of the dummy word lines is formed in a lower-level, the main dummy word line being formed in an upper-level, the semiconductor device further comprising a plurality of contact plugs each connecting the main dummy word line in the upper-level and a corresponding one of the dummy word lines in the lower-level.

13. The semiconductor device as claimed in claim 11, wherein the dummy word line control circuit is configured to control a potential of the main dummy word line in response to a test signal.

14. The semiconductor device as claimed in claim 13, wherein the dummy word line control circuit is configured to fix a potential of the main dummy word line when the test signal takes a first value.

15. The semiconductor device as claimed in claim 14, wherein the dummy word line control circuit is configured to render the main dummy word line electrically floated when the test signal takes a second value.

* * * * *